US006776060B2

United States Patent
Miao et al.

(10) Patent No.: US 6,776,060 B2
(45) Date of Patent: Aug. 17, 2004

(54) ELECTRONIC COMPONENT SUCKING DEVICE AND ELECTRONIC COMPONENT TESTING APPARATUS HAVING THE SAME

(75) Inventors: Bin Miao, Aomori (JP); Shoichi Okuyama, Nagano (JP)

(73) Assignee: Fujitsu Media Devices Limited, Nagano (JP)

( * ) Notice: Subject to any disclaimer, the term of this patent is extended or adjusted under 35 U.S.C. 154(b) by 0 days.

(21) Appl. No.: 10/273,178

(22) Filed: Oct. 18, 2002

(65) Prior Publication Data

US 2003/0090258 A1 May 15, 2003

(30) Foreign Application Priority Data

Nov. 15, 2001 (JP) ........................................ 2001-350504

(51) Int. Cl.[7] .............................................. G01M 19/00
(52) U.S. Cl. ..................................................... 73/865.8
(58) Field of Search .......................... 29/832, 740, 834; 324/158.1; 73/865.8, 37, 425.6, 423 A; 414/226; 228/6.2

(56) References Cited

U.S. PATENT DOCUMENTS

| | | | | |
|---|---|---|---|---|
| 3,853,011 A | * | 12/1974 | Baumann ................... 73/423 A |
| 4,133,211 A | * | 1/1979 | Sarstedt ..................... 73/425.6 |
| 4,515,507 A | * | 5/1985 | Asai et al. ................... 414/226 |
| 4,611,397 A | * | 9/1986 | Janisiewicz et al. .......... 29/834 |
| 4,659,004 A | * | 4/1987 | Fridman ..................... 228/6.2 |
| 6,076,394 A | * | 6/2000 | Tsuda et al. ................... 73/37 |

* cited by examiner

Primary Examiner—Edward Lefkowitz
Assistant Examiner—Octavia Davis
(74) Attorney, Agent, or Firm—Arent Fox PLLC

(57) ABSTRACT

Disclosed are an electronic component sucking device and an electronic component testing apparatus using the same, the sucking device comprising a suction head having at its extremity an opening arranged to suck an electronic component when a negative pressure is applied thereto; a hold-down center rod having an aperture, a conduit through which passes a gas supplied or discharged through the opening of the suction head, and a hold-down portion at its extremity adapted to be inserted into the interior of the suction head; a coil spring for imparting a biasing force to the suction head and the hold-down center rod; and a link lever interposed between the suction head and the hold-down center rod; wherein
when the hold-down center rod is subjected to a force pressing down against the biasing force of the coil spring, the link lever pushes the suction head upward so that the hold-down portion of the hold-down center rod protrudes from the suction head.

4 Claims, 8 Drawing Sheets

ELECTRONIC COMPONENT SUCKING DEVICE AND ELECTRONIC COMPONENT TESTING APPARATUS HAVING THE SAME

BACKGROUND OF THE INVENTION

1. Field of the Invention

The present invention relates to an electronic component sucking device for sucking electronic components and conveying them for feed to predetermined jigs, and to an electronic component testing apparatus using the electronic component sucking device.

2. Description of the Related Arts

In the electronic component manufacturing process, the electronic component testing apparatus uses the electronic component sucking device to deliver electronic components to predetermined sites and position them on measurement jigs.

FIGS. 1A to 1C illustrate a conceptual configuration of an example of the conventional electronic component sucking device. Referring to FIG. 1A, the electronic component sucking device comprises a nozzle-shaped suction head 10 located at its one end and having an intake/exhaust opening for taking in or exhausting gases. A hose 11 is connected to the other end of the electronic component sucking device so that a pump not shown can regulate a suction negative pressure at the extremity of the suction head 10.

The material of the suction head 10 can be ceramic, metal, resin, etc. The extremity of the suction head 10 can be for example round or square in section, corresponding to the contours of the electronic components to be sucked.

By applying a negative pressure to the intake/exhaust opening of the suction head 10, an electronic component can be sucked by the suction head 10. With the electronic component being sucked, the measurement jigs are displaced relative to the electronic component sucking device so that the electronic component can be positioned on a predetermined measurement jig.

The electronic component positioned on the measurement jig is brought into a contact with an electrode of the measurement jig under a predetermined pressure and subjected to a given measurement test. With the electronic component adhered to the suction head 10 by suction, the measurement test is effected while pressing the suction head 10 against the measurement jig. After the measurement, the suction negative pressure is released and a positive pressure is exerted to disengage the electronic component from the suction head 10.

The conventional suction head 10 may possibly suffer a contact failure between the electronic component terminal and the measurement jig terminal at the time of measurement, due to poor registration accuracy, abrasion of the suction head 10, or ununiformity in shape of electronic components. FIGS. 1B and 1C are explanatory diagrams of such states.

In FIG. 1B, a negative pressure is applied to the suction head 10 to suck an electronic component W to be sucked. If the electronic component sucking device has an accurate registration normal to the measurement jig, then a measurement electrode of the measurement jig not shown will come into correct contact with a terminal electrode of the electric component W so that the measurement becomes feasible.

However, if the electronic component sucking device has an inaccurate registration with angular offset as shown in FIG. 1C, then it will become difficult for the measurement electrode of the measurement jig to come into correct contact with the terminal electrode of the electronic component W, making the measurement infeasible.

SUMMARY OF THE INVENTION

It is therefore the object of the present invention to provide an electronic component sucking device capable of eliminating the above contact failure to achieve secure contact between the electronic component terminal and the measurement jig electrode and thereby enhancing the reliability of electronic component measurement, and to provide an electronic component testing apparatus using the electronic component sucking device.

In order to achieve the above object, according to an aspect of the present invention there is provided a sucking device comprising a suction head having at its extremity an opening arranged to suck an electronic component when a negative pressure is applied thereto; a hold-down center rod having an aperture, and a conduit through which passes a gas supplied or discharged through the opening of the suction head, the hold-down center rod having at its extremity a hold-down portion adapted to be inserted into the interior of the suction head; a coil spring for imparting a biasing force to the suction head and the hold-down center rod; and a link lever interposed between the suction head and the hold-down center rod; wherein when the hold-down center rod is subjected to a force pressing down against the biasing force of the coil spring, the link lever pushes the suction head upward so that the hold-down portion of the hold-down center rod protrudes from the suction head.

Preferably, at least the extremity of the hold-down portion of the hold-down center rod is made of an insulating material.

At least the extremity of the hold-down portion of the hold-down center rod may form part of a spherical surface.

The sucking device may further comprise a guide coupled integratedly with the suction head, the guide having a notch partially formed therein for receiving the link lever; and a hold-down member coupled integratedly with the hold-down center rod, the hold-down member holding down the link lever received in the notch of the guide; wherein the link lever has a support and two arms, one of the two arms being in contact with the notch of the guide, the other of the two arms being in contact with the hold-down member.

The above and other objects, aspects, features and advantages of the present invention will become more apparent from the following description of the embodiment of the present invention when taken in conjunction with the accompanying drawings.

DESCRIPTION OF THE PREFERRED EMBODIMENT

Figure 1A:
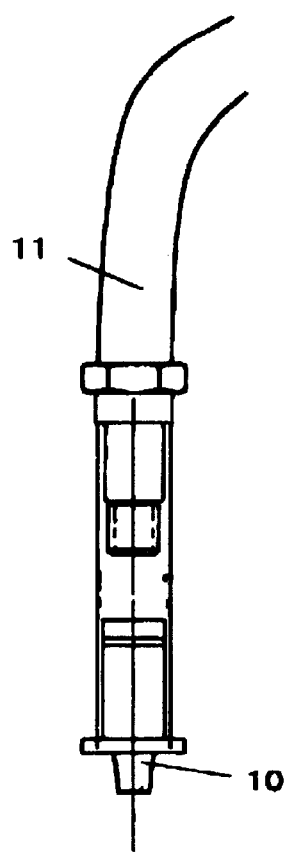
FIGS. 1A to 1C illustrate a conceptual configuration of an example of the conventional electronic component sucking device.
Figure 1B:
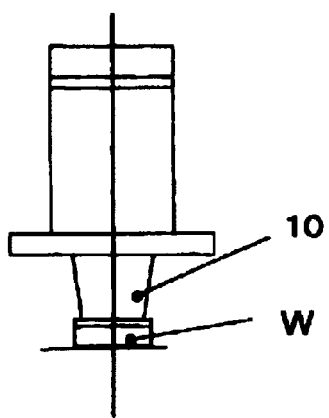
Figure 1C:
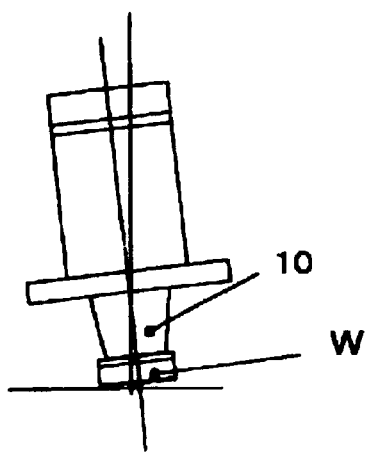

An embodiment of the present invention will now be described with reference to the accompanying drawings. It will be understood that the embodiment shown in the drawings is only for the purpose of explaining the present invention and that application of the present invention is not limited to the embodiment.

Figure 2A:
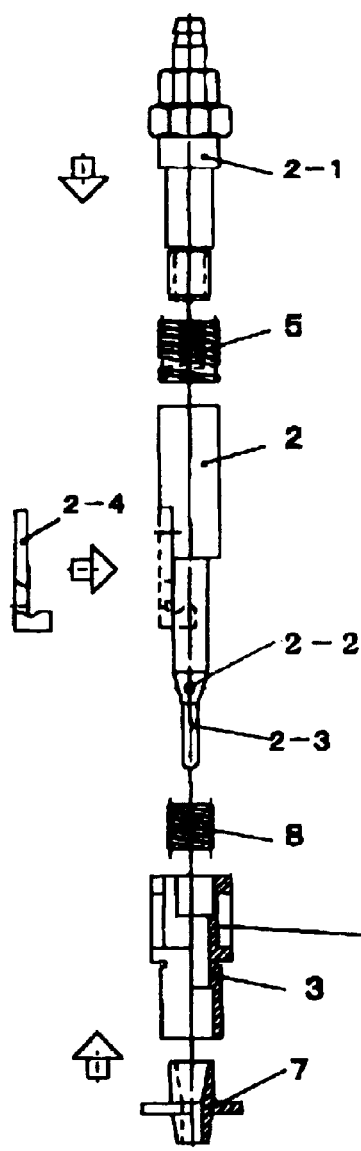
FIGS. 2A and 2B illustrate an internal structure of an embodiment configuration of an electronic component sucking device in accordance with the present invention.
Figure 2B:
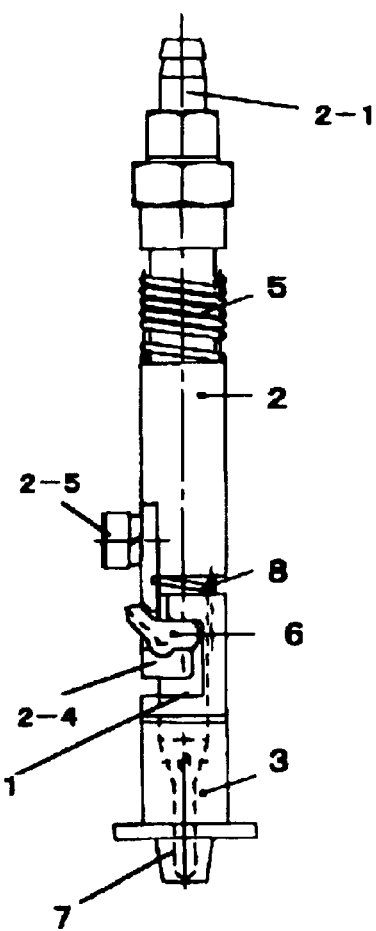
Figure 3A:
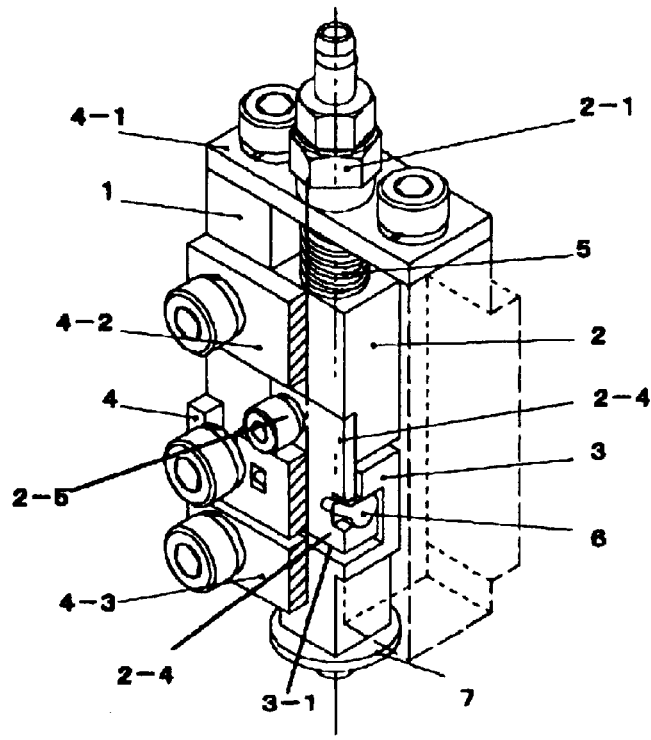
FIGS. 3A to 3C illustrate an external structure of an embodiment configuration of the electronic component sucking device in accordance with the present invention.
Figure 3B:
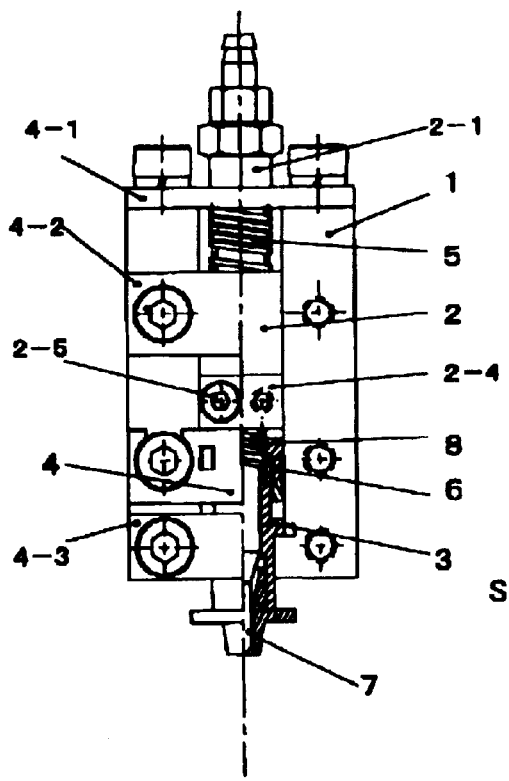
Figure 3C:
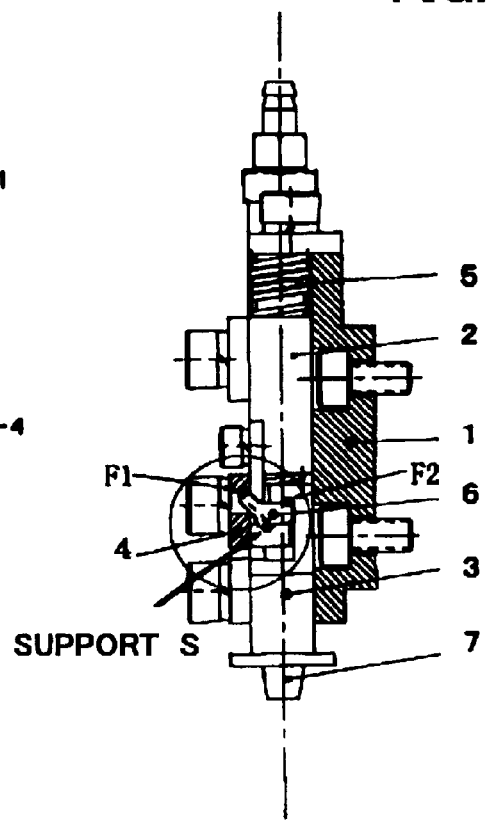

FIGS. 2A and 2B and FIGS. 3A to 3C are diagrams explaining an embodiment of an electronic component sucking device in accordance with the present invention, with FIGS. 2A and 2B showing an internal structure thereof and FIGS. 3A to 3C showing an external structure thereof.

Referring to FIGS. 2A and 2B, FIG. 2A shows constituent parts of the internal structure in exploded view, with FIG. 2B showing the assembled state thereof. The internal structure comprises a hold-down center rod 2, a suction head 7 into which the hold-down center rod 2 is inserted, and a guide 3 for the suction head 7. The hold-down center rod 2 includes a connection 2-1 for a suction hose connected to a pump not shown, an aperture 2-2 for taking in and exhausting a gas, through which the gas centrally passes, and a hold-down portion 2-3 formed at the extremity thereof.

The suction head 7 has an opening which is subjected to a negative pressure or a positive pressure by intake/exhaust of the gas through the suction hose so that an electronic component can be sucked or released.

In FIG. 2A, the right halves of the suction head 7 and of the guide 3 for the suction head 7 are shown in section. These members are put together as shown in FIG. 2B by interposing a first coil spring 5 between the connection 2-1 for the suction hose and the hold-down center rod 2, and by interposing a second coil spring 8, received in the guide 3, between the hold-down center rod 2 and the suction head 7.

FIG. 2B represents a right-hand profile of the state where the members of FIG. 2A have been put together. In this assembled state, a holder 2-4 is coupled via a screw 2-5 to the hold-down center rod 2 such that a link lever 6 is clamped by an L-shaped end of the holder 2-4 in the region of a notch 3-1 of the guide 3.

Reference is made to FIGS. 3A to 3C to further describe the external structure. FIG. 3A is an external perspective view of the sucking device, in which the right-hand members are partly removed (indicated by broken lines) to facilitate the understanding. FIG. 3B is a side elevation of the perspective view of FIG. 3A, viewed from left front, and FIG. 3C is a side elevation of the perspective view of FIG. 3A, viewed from right front.

The sucking device comprises a pair of bases 1 for laterally clamping the internal structure of FIGS. 2A and 2B therebetween which includes the connection 2-1 for the suction hose, the hold-down center rod 2, the guide 3 and the suction head 7, which are integrated by way of the first coil spring 5 and the second coil spring 8. The sucking device further comprises cover plates 4-1, 4-2 and 4-3 for supporting the pair of bases 1 by screwing.

The link lever 6, retained by the holder 2-4 and the notch 3-1 of the guide 3, is supported by a link lever hold-down plate 4 which has a notch 4-4 freeing a protrusion of the link lever 6.

As indicated by the encircled portion of FIG. 3C, the link lever 6 supported by the link lever hold-down plate 4 is subjected, around a support S in contact with the L-shaped end of the holder 2-4, to a force F1 at a point where the protrusion of the link lever 6 comes into contact with the notch 4-4 of the link lever hold-down plate 4, and to a force F2 at a point where the protrusion of the link lever 6 comes into contact with the notch 3-1 of the guide 3.

FIGS. 4A to 4C and FIGS. 5A to 5C are explanatory diagrams of actions of the sucking device having the structure shown in FIGS. 2A and 2B and FIGS. 3A to 3C.

Figure 4A:
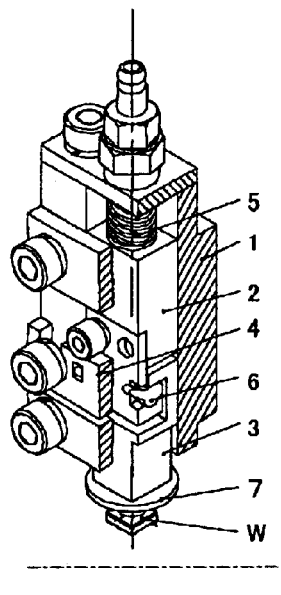
FIGS. 4A to 4C illustrate external actions of the sucking device.
Figure 4B:
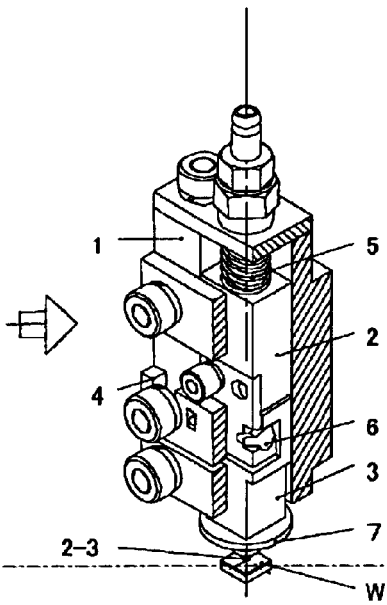
Figure 4C:
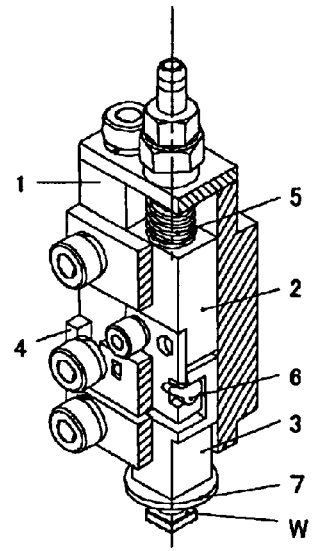
Figure 5A:
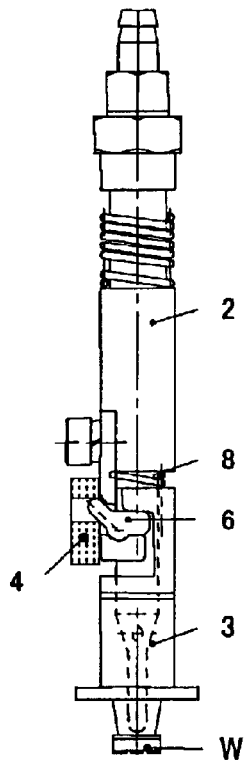
FIGS. 5A to 5C illustrate actions of the internal structure of the sucking device.
Figure 5B:
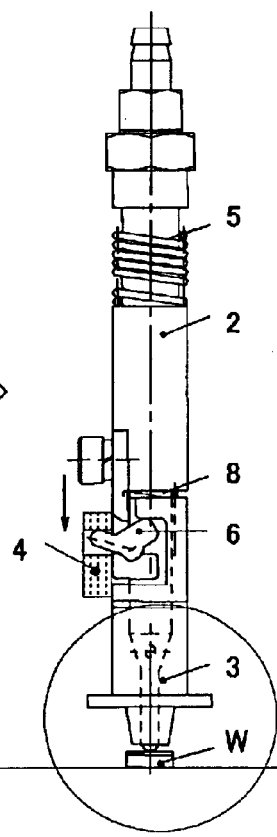
Figure 5C:
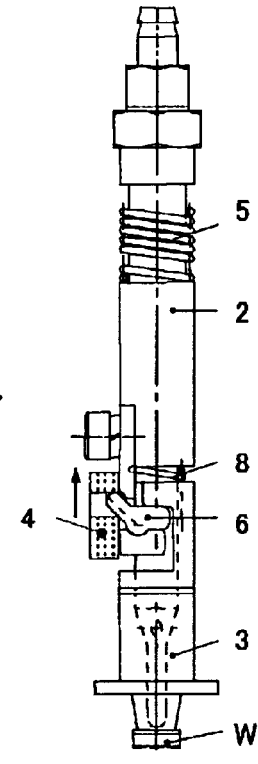

For ease of understanding, FIGS. 4A to 4C show the external actions of the sucking device and FIGS. 5A to 5C show the actions of the internal structure shown in FIGS. 2A and 2B. The actions of FIGS. 4A→4B→4C are shown in synchronism with the actions of FIGS. 5A→5B→5C, respectively.

FIGS. 4A and 5A show the state where an electronic component W is adhered by suction to the extremity of the suction head 7. In this state, the guide 3 is pressed downward by the second coil spring 8 and thus the hold-down center rod 2 is housed within the interior of the guide 3.

Figure 6A:
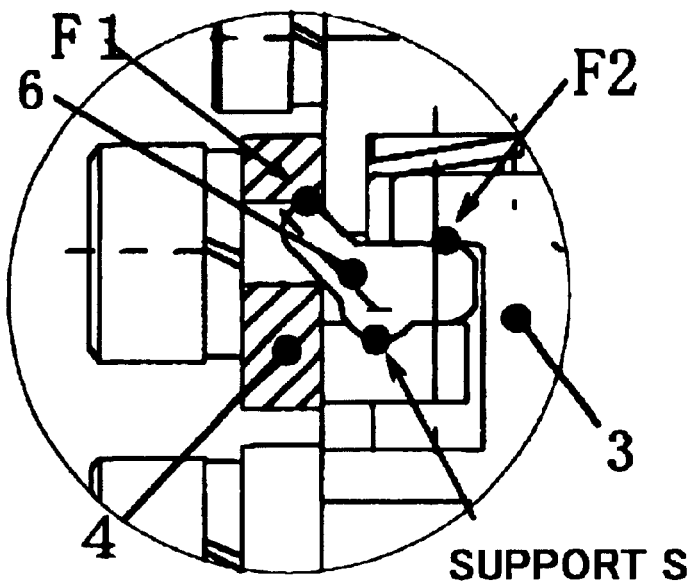
FIGS. 6A and 6B illustrate enlarged views of the status where a protrusion of a link lever 6 is pressed down around a support S.

Upon the measurement, the sucking device lowers as shown in FIGS. 4B and 5B so that the terminal of the sucked electronic component W comes into contact with the electrode of a measurement jig not shown. When the sucking device further lowers, the protrusion of the link lever 6 is pressed down around the support S by the force F1 at the point in contact with the notch 4-4 of the link lever hold-down plate 4. This state is shown in an enlarged manner in FIGS. 6A and 6B. FIG. 6A shows the state of the link lever 6 corresponding to the state of FIGS. 4A and 5A, where the force F1 at the point in contact with the notch 4-4 of the link lever hold-down plate 4 balances with the force F2 at the point in contact with the notch of the guide 3.

Figure 6B:
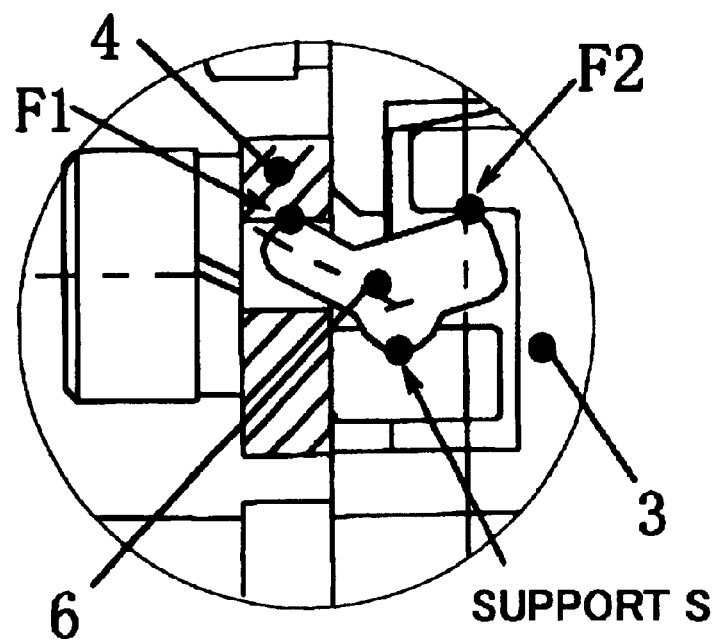

On the contrary, the state of FIG. 6B corresponds to the state of FIGS. 4B and 5B, in which the protrusion of the link lever 6 is pressed down by the downward force F1 at the point in contact with the notch 4-4 of the link lever hold-down plate 4 so that the link lever 6 is turned around the support S. This results in the state where the guide 3 is pushed up by the upward force F2 at the point in contact with the notch of the guide 3. Thus, the extremity 2-3 of the hold-down center rod 2 projects downward from the suction head 7.

The state of FIGS. 4C and 5C is the state where the sucking device is pulled up after the termination of the measurement. At that time, due to the impact resilience of the coil spring 8, the downward force F1 at the point in contact with the notch 4-4 of the hold-down plate 4 disappears, allowing a return to the same state as in FIGS. 4A and 5A.

Figure 7:
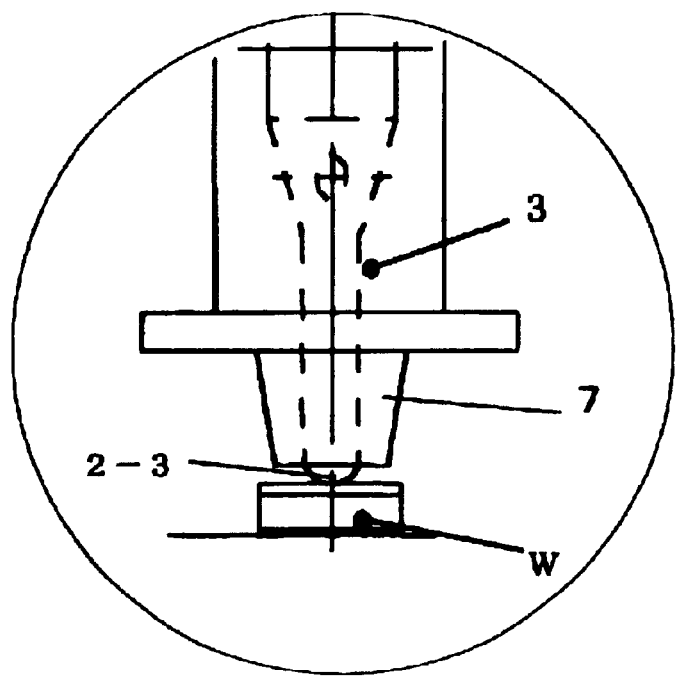
FIG. 7 is an enlarged view of an encircled portion of FIG. 5B.

FIG. 7 is an enlarged view of the encircled portion of FIG. 5B. The extremity 2-3 of the hold-down center rod 2 projects downward from the suction head 7 such that the electronic component W to be measured is pressed against the measurement jig not shown.

Figure 8A:
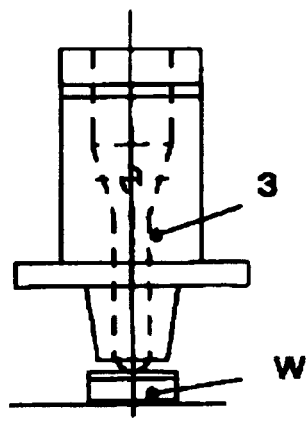
FIGS. 8A and 8B illustrate effects presented by the sucking device of the present invention.
Figure 8B:
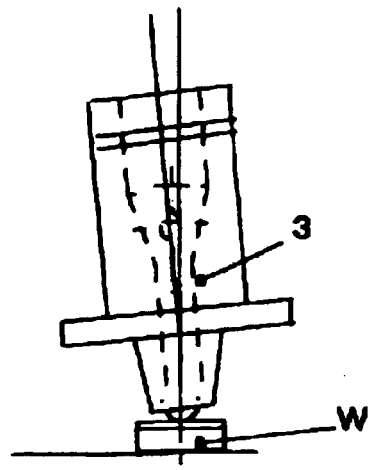

FIGS. 8A and 8B show the effect presented by the sucking device of the present invention. The extremity 2-3 of the hold-down center rod 2 of FIG. 5B is in the form of a projection. Hence, the present invention allows a downward pressing of the electronic component W to be measured even though the sucking device has ahead center angular off set relative to the measurement jig (see FIG. 8B), similar to the state of FIG. 8A where the sucking device is correctly positioned relative to the measurement jig.

This enables the terminal of the electronic component W to be measured and the measurement jig electrode to come into correct contact with each other at the extremity 2-3 of the hold-down center rod 2, making the measurement feasible. Thus, the extremity 2-3 of the hold-down center rod 2 serves to equally divide the pressure acting on the electronic component, thereby improving the electric contact ability to obtain a satisfactory measurement accuracy.

The extremity 2-3 of the hold-down center rod 2 is made of an insulating material so that the characteristic tests can be effected without causing any adverse effects on the high-frequency electronic components.

In the embodiment, the diameter of the extremity 2-3 of the hold-down center rod 2 is 1.5 mm with respect to the opening of the suction head 7 being 2.0 mm in diameter, whereby any small electronic components can correctly be positioned on the measurement jig.

The above mechanism of the sucking device of the present invention is free from any complicated control so that the suction, conveyance and testing of the electronic components can be performed by use of only the suction negative pressure and vertical movement of the device.

Figure 9A:
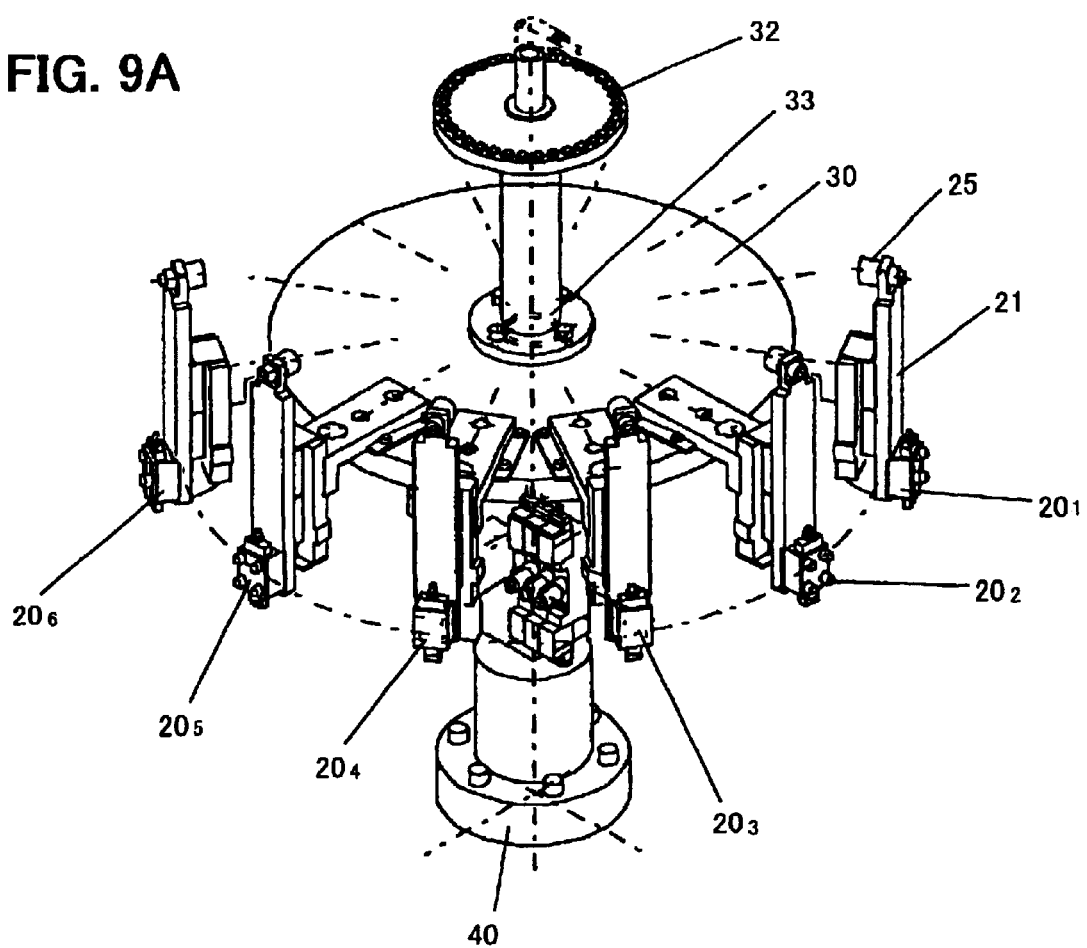
FIGS. 9A and 9B are explanatory diagrams of an electronic component testing apparatus using the sucking device of the present invention.
Figure 9B:
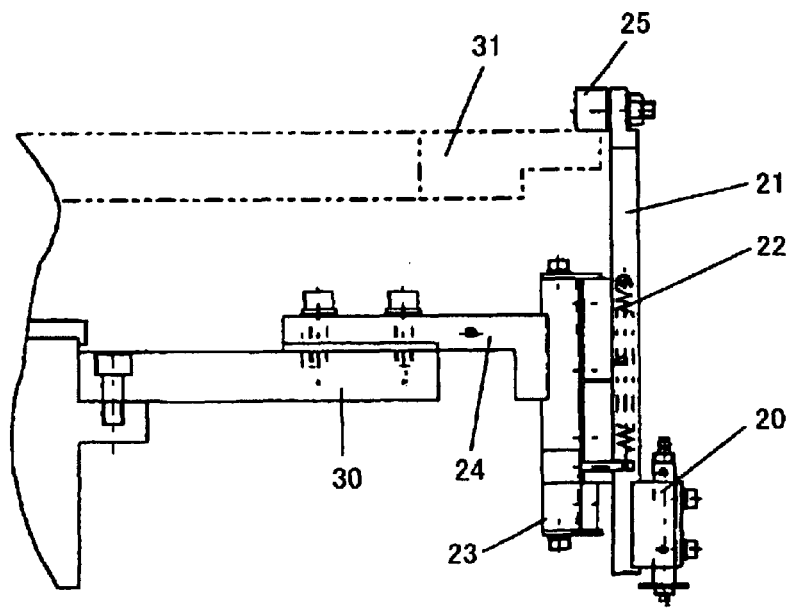

FIGS. 9A and 9B are explanatory diagrams of an electronic component testing apparatus using the sucking device of the present invention described hereinabove.

FIG. 9A is a diagram, viewed diagonally from upper front, of a major part of a rotary mechanism of the testing apparatus. A supporting column 33 is rotatably mounted on a pedestal 40, with a gear 32 being fed with a power not shown. Arrangement is such that a disk 30 linked with the supporting column 33 is rotated, the disk 30 having a plurality of sucking devices $20_1$ to $20_6$ which are circumferentially disposed.

FIG. 9B is a sectional view showing the relationship between the disk 30 and the circumferentially disposed sucking device. The sucking devices $20_1$ to $20_6$ are each fitted to a vertical support member 21 at its lower portion and are each attached by a horizontal support member 24 via a coupling member 23 to the disk 30.

Opposite ends of a spring 22 are connected to the vertical support member 21 and the coupling member 23, with the spring 22 urging downward at all times the vertical support member 21 and thus each of the sucking device $20_1$ to $20_6$ fitted to the vertical support member 21. A member 25 is fitted to the upper portion of the vertical support member 21 fitted at its lower portion with each of the sucking devices $20_1$ to $20_6$. The member 25 slides on the top surface of a positioning member 31 (not shown in FIG. 9A) located above the disk 30.

The positioning member 31 is a stationary disk-shaped plate and serves to urge the sucking device downward by the spring 22 at a predetermined position of the testing apparatus which will be described later. Therefore, as shown in FIG. 9B, the positioning member 31 is provided with a notch at the predetermined position such that the member 25 above each of the sucking devices $20_1$ to $20_6$ is disengaged from the top surface of the positioning member 31.

Figure 10:
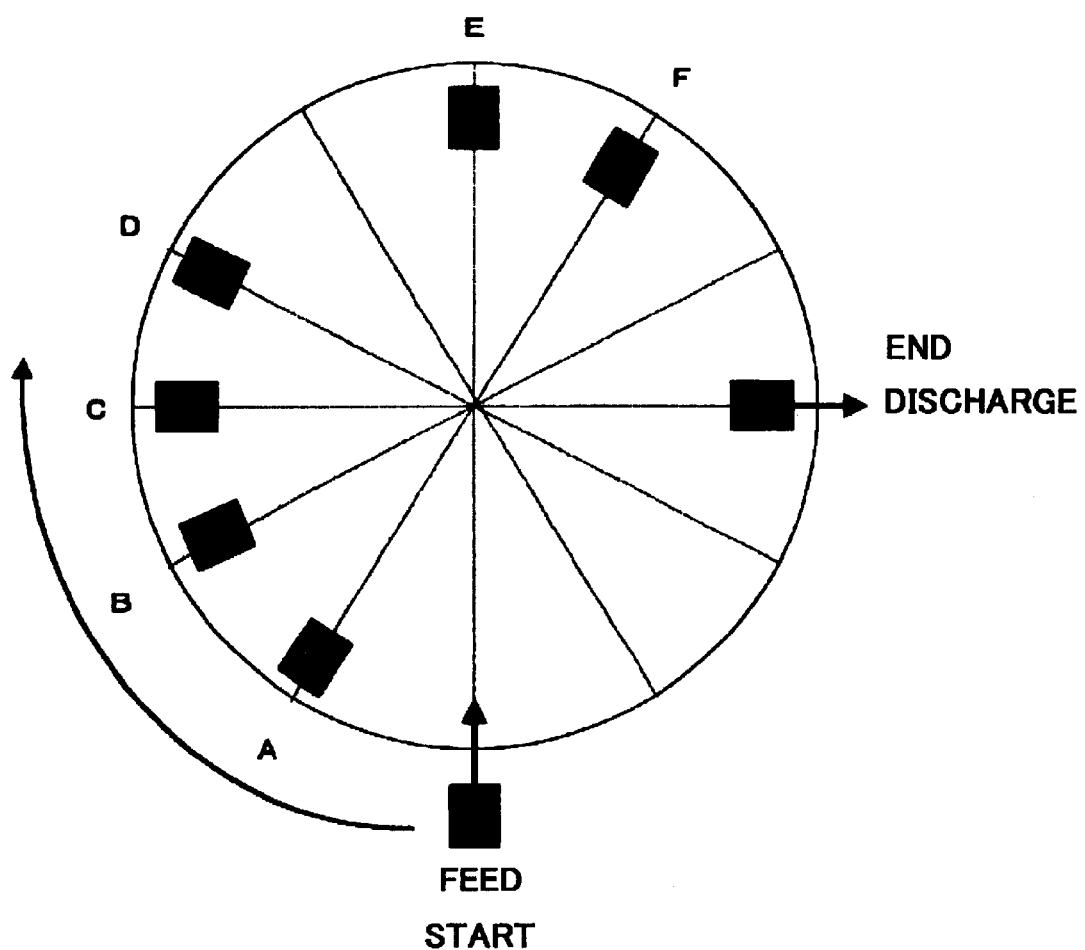
FIG. 10 shows by way of example a predetermined position to which the sucking device is pressed down, determined by a positioning member 31.

FIG. 10 shows by way of example the predetermined position to which the sucking device is pressed down, defined by the positioning member 31.

In FIG. 10, when an electronic component is first fed to START position, the electronic component is sucked by the suction head 7 of the sucking device. The sucking device rotates with the electronic component adhered thereto by suction, to move to position A where it is detected whether the electronic component is adhered by suction to the suction head 7. If no electronic component adheres thereto, a suction failure is judged.

The sucking device then moves to position B, where the electronic component is released from the suction head and placed on a rotary table to receive a rotary control for the orientation to a predetermined direction.

After having been oriented to the predetermined direction, the electronic component is sucked and moved to position C by the sucking device. Hereat, as described with reference to FIGS. 4A to 4C and 5A to 5C, the terminal of the electronic component is brought into contact with the electrode of the measurement jig to effect a given first measurement test. After the termination of the first measurement test, the sucking device further moves to position D to effect a given second measurement.

At position E, a defective electronic component is discharged depending on the measurement results. Further, at position F, it is detected whether the defective electronic component is discharged or not.

The electronic component rotates to move to END position, where it is discharged as a non-defective component.

According to the embodiment of the present invention set forth in greater detail hereinabove with reference to the drawings, there is provided a sucking device for moving an electronic component to a predetermined position when the electronic component is measured by the present invention. There are also provided an electronic component sucking device which ensures a secure contact between the electronic component terminal and the measurement jig electrode to thereby enhance the reliability of the measurement of electronic components, and an electronic component testing apparatus using the electronic component sucking device.

What is claimed is:

1. A sucking device comprising:

a suction head having at its extremity an opening arranged to suck an electronic component when a negative pressure is applied thereto;

a hold-down center rod having an aperture, a conduit through which passes a gas supplied or discharged through said opening of said suction head, and a hold-down portion at its extremity adapted to be inserted into the interior of said suction head;

a coil spring for imparting a biasing force to said suction head and said hold-down center rod; and a link lever interposed between said suction head and said hold-down center rod; wherein when said hold-down center rod is subjected to a force pressing down against said biasing force of said coil spring, said link lever pushes said suction head upward so that said hold-down portion of said hold-down center rod protrudes from said suction head.

2. The sucking device according to claim 1, wherein at least the extremity of said hold-down portion of said hold-down center rod is made of an insulating material.

3. The sucking device according to claim 1, wherein at least the extremity of said hold-down portion of said hold-down center rod forms part of spherical surface.

4. The sucking device according to claim 1, further comprising:
- a guide coupled integratedly with said suction head, said guide having a notch partially formed therein for receiving said link lever; and
- a hold-down member coupled integratedly with said hold-down center rod, said hold-down member holding down said link lever received in said notch of said guide; wherein said link lever has a support and two arms, one of said two arms being in contact with said notch of said guide, the other of said two arms being in contact with said hold-down member.

* * * * *